(12) United States Patent
Hatta et al.

(10) Patent No.: US 8,796,704 B2
(45) Date of Patent: Aug. 5, 2014

(54) EMISSIVE DISPLAY HAVING POLARIZER AND RETARDER FILMS

(75) Inventors: Yoshihisa Hatta, Chu-Nan (TW);
Pao-Chung Wu, Chu-Nan (TW)

(73) Assignee: Innolux Corporation, Chu-Nan (TW)

( * ) Notice: Subject to any disclaimer, the term of this patent is extended or adjusted under 35 U.S.C. 154(b) by 123 days.

(21) Appl. No.: 13/099,292

(22) Filed: May 2, 2011

(65) Prior Publication Data
US 2012/0280259 A1 Nov. 8, 2012

(51) Int. Cl.
*H01L 27/15* (2006.01)

(52) U.S. Cl.
USPC .............. 257/89; 257/59; 257/72; 438/149; 438/151; 438/197

(58) Field of Classification Search
USPC .............. 257/59, 72; 438/149, 151, 197
See application file for complete search history.

(56) References Cited

U.S. PATENT DOCUMENTS

| | | | |
|---|---|---|---|
| 5,235,449 A | 8/1993 | Imazeki et al. | |
| 6,124,907 A | 9/2000 | Jones et al. | |
| 6,169,590 B1 * | 1/2001 | Abileah et al. | 349/120 |
| 6,587,168 B2 * | 7/2003 | Jones et al. | 349/96 |
| 6,747,717 B2 * | 6/2004 | Moon | 349/97 |
| 6,781,647 B2 * | 8/2004 | Fujieda | 349/61 |
| 6,987,547 B2 * | 1/2006 | Yang et al. | 349/69 |
| 7,012,365 B2 * | 3/2006 | Adachi et al. | 313/504 |
| 7,230,594 B2 * | 6/2007 | Miller et al. | 345/82 |
| 7,253,859 B2 * | 8/2007 | Ishizaki | 349/117 |
| 7,402,951 B2 | 7/2008 | Cok | |
| 7,440,044 B2 * | 10/2008 | Peterson et al. | 349/61 |
| 7,671,520 B2 * | 3/2010 | Jagt et al. | 313/110 |
| 2004/0069985 A1 | 4/2004 | Cok | |
| 2007/0058258 A1 * | 3/2007 | Mather et al. | 359/619 |
| 2008/0100781 A1 * | 5/2008 | Choo et al. | 349/96 |
| 2009/0051284 A1 * | 2/2009 | Cok et al. | 313/506 |
| 2009/0091238 A1 * | 4/2009 | Cok et al. | 313/498 |
| 2009/0167991 A1 * | 7/2009 | Young et al. | 349/69 |
| 2010/0019668 A1 * | 1/2010 | Koo | 313/504 |
| 2010/0033557 A1 * | 2/2010 | Abe et al. | 348/58 |
| 2011/0128475 A1 * | 6/2011 | Park et al. | 349/96 |
| 2011/0128476 A1 * | 6/2011 | Park et al. | 349/96 |

FOREIGN PATENT DOCUMENTS

EP 1873577 1/2008

OTHER PUBLICATIONS

Lee et al, "A Highly Efficient Organic Light-Emitting Diode with an Imprinted In-Cell Polarizer for Backlight Applications", Journal of Information Display, vol. 9, No. 4, Dec. 2008, pp. 11-14.

* cited by examiner

*Primary Examiner* — Lex Malsawma
*Assistant Examiner* — Sheng Zhu
(74) *Attorney, Agent, or Firm* — Liu & Liu

(57) ABSTRACT

A system for displaying images is provided. The system includes an emissive display device including a plurality of pixel elements arranged in an array. Each pixel element includes a first substrate and a second substrate disposed thereunder, wherein the first substrate includes at least three subpixel regions. An organic light-emitting device is disposed between the first and second substrates and on the second substrate. At least one patterned polarizer film is disposed between the first and second substrates to be correspondingly located at one of the subpixel regions. At least one retarder film is disposed between the first and second substrates and affixed to the patterned polarizer film.

20 Claims, 5 Drawing Sheets

EMISSIVE DISPLAY HAVING POLARIZER AND RETARDER FILMS

BACKGROUND OF THE INVENTION

1. Field of the Invention

The invention relates to a flat panel display (FPD), and in particular to an emissive display device with a polarizer film and a retarder film.

2. Description of the Related Art

Recently, with the development and wide application of electronic products such as mobile phones, PDAs, and notebook computers, there has been an increasing demand for flat panel displays (FPDs) which consume less electric power and occupy less space. Organic light emitting diode (OLEDs) and organic electroluminescent display (OELDs) are self-emissive and highly luminous, with a wide viewing angle, a fast response time, and a simple fabrication process. Thus, OELD/OLED displays have become an industry display of choice.

An OLED typically has a reflector or reflective electrode to enhance the output of emitted light through one side of the OLED. However, the reflector or reflective electrode also reflects ambient light, which causes the contrast ratio of the OLED to be reduced. As is known in the art, a circular polarizer including a polarizer film and a retarder film is entirely affixed to the exterior surface of a display device including the OLED, so that the ambient light incident on the display device is absorbed by the circular polarizer plate. Accordingly, reflected ambient light can be greatly reduced, thereby reducing glare in the display device to obtain a clear black display.

For emissive display devices, such as organic light-emitting display devices, overall light efficiency is an important factor for performance. In general, the circular polarizer is used to reduce the reflection of the ambient light. However the transparency of the circular polarizer is about 40% to 50%, such that the emitting efficiency of an emissive display device with the circular polarizer is reduced.

Accordingly, there exists a need in the art for development of a novel emissive display device, which is capable of mitigating the deficiencies mentioned above.

BRIEF SUMMARY OF THE INVENTION

A detailed description is given in the following embodiments with reference to the accompanying drawings. An exemplary embodiment of a system for displaying images comprises an emissive display device comprising a plurality of pixel elements arranged in an array. Each pixel element includes a first substrate and a second substrate disposed thereunder, wherein the first substrate includes at least three subpixel regions. An organic light-emitting device is disposed between the first and second substrates and on the second substrate. At least one patterned polarizer film is disposed between the first and second substrates to be correspondingly located at one of the subpixel regions. At least one retarder film is disposed between the first and second substrates and affixed to the patterned polarizer film.

Another exemplary embodiment of a system for displaying images comprises an emissive display device comprising a plurality of pixel elements arranged in an array. Each pixel element includes a first substrate and a second substrate disposed thereunder, wherein the first substrate includes at least three subpixel regions. An organic light-emitting device is disposed between the first and second substrates and on the second substrate. At least one patterned polarizer film is disposed on the first substrate and opposite to the organic light-emitting device, to be correspondingly located at one of the subpixel regions. At least one retarder film is disposed between the first substrate and the patterned polarizer film.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
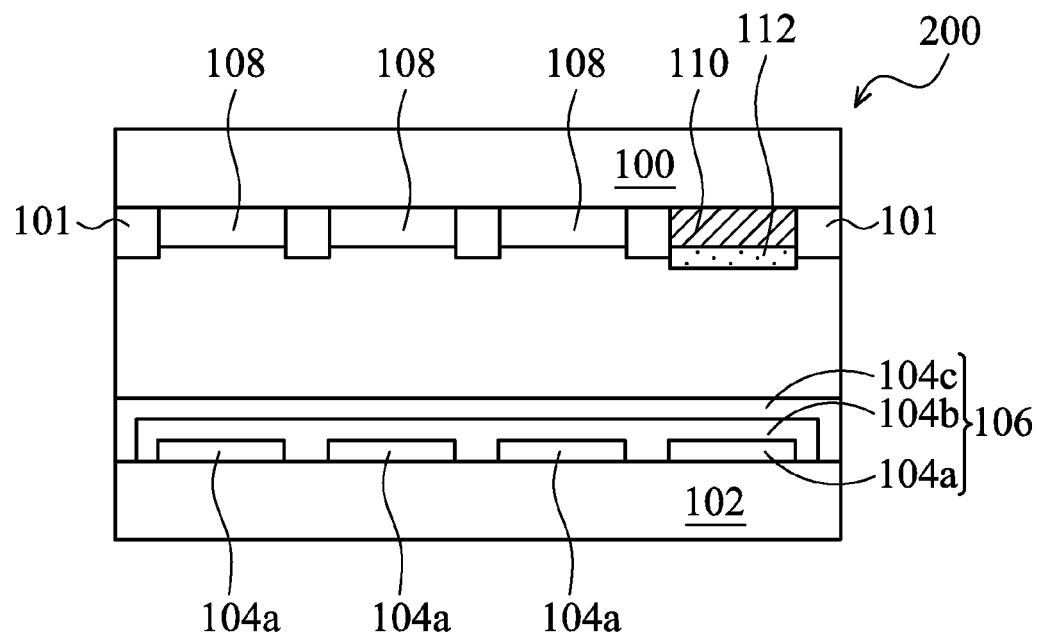
FIGS. 1 to 8 are cross section views of various exemplary embodiments of a system for displaying images, including an emissive display device, according to the invention.

Systems for displaying images are provided. FIG. 1 illustrates an exemplary embodiment of a system for displaying images according to the invention, and in particular, to a system for displaying images, including an emissive display device 200. In the embodiment, the emissive display device 200 comprises a plurality of pixel elements arranged in an array. Here, in order to simplify the diagram, only a pixel element is depicted. The pixel element comprises a first substrate 100, a second substrate 102, an organic light-emitting device (OLED) 106, at least one patterned polarized film 110, and at least one retarder film 112.

The first substrate 100 may serve as a cover plate and/or a color filter substrate, and may include glass, quartz, plastic or other transparent materials. The first substrate 100 of the pixel element includes at least three subpixel regions which are typically surrounded by a black matrix (BM) 101 disposed on the first substrate 100. For example, the pixel element includes four subpixel regions for displaying red, green, blue, and white colors.

The second substrate 102 is disposed opposite to or under the first substrate 100 and may serve as a thin film transistor (TFT) array substrate. The second substrate 102 may also include glass, quartz, plastic or other transparent materials. In some embodiments, the second substrate 102 may include an opaque material such as metal foil substrate.

The OLED 106, such as an active or passive matrix OLED, is disposed between the first and second substrates 100 and 102. In the embodiment, the OLED 106 may also a top-emission type OLED which comprises a plurality of anode layers 104a corresponding to the subpixel regions, an organic light-emitting layer 104b covering the plurality of anode layers 104a, and a cathode layer 104c covering the organic light-emitting layer 104b. The anode layer 104a, such as an ITO or indium zinc oxide (IZO) layer, is disposed on the second substrate 102. The organic light-emitting layer 104b may comprise a stack of a hole injecting layer (HIL), a hole transporting layer (HTL), an electroluminescent layer (EML), an electron transporting layer (ETL), and an electron injecting layer (EIL). Here, in order to simplify the diagram, only a flat layer is depicted. Moreover, the organic light-emitting layer 104b may be employed for emitting a white light. Namely, the OLED 106 may be a white OLED. The cathode layer 104c may comprise a thin metal layer (not shown) and a transparent conductive layer (not shown), such as ITO or IZO layer.

Unlike the conventional circular polarizer for a display device, which is entirely affixed to an exterior surface thereof, in the embodiment, particularly, at least one patterned polarizer film 110 is disposed between the first and second substrates 100 and 102. Moreover, the patterned polarizer film 110 may correspondingly cover a red, green, blue, or white subpixel region. For example, the patterned polarizer film 110 is located at a white subpixel region of the first substrate 100 and is disposed between the first substrate 100 and the OLED 106. Moreover, at least one retarder film 112 is disposed between the first and second substrates 100 and 102 and is affixed to the patterned polarizer film 110. In the embodiment, three color filter films 108 (i.e., red, green, and blue color filter films) may be disposed between the first and second substrates 100 and 102 to respectively cover the subpixel regions without the patterned polarizer film 110 located thereat; however not disposing the color filter films 108 may also be acceptable in some embodiments.

Figure 2:
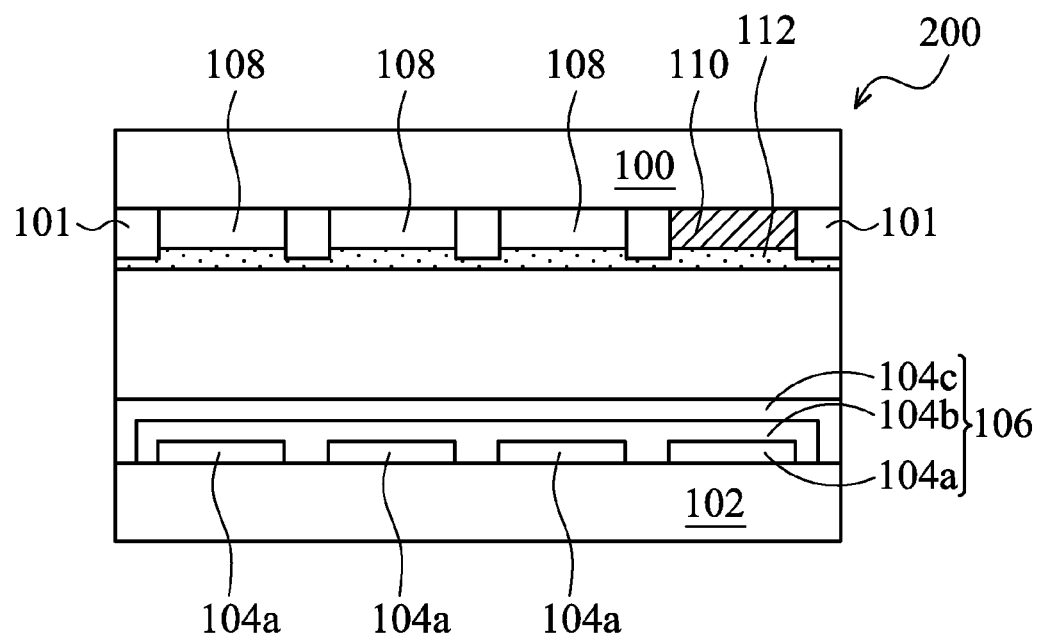

Referring to FIG. 2, which illustrates another exemplary embodiment of a system for displaying images according to the invention. Elements in FIG. 2 that are the same as those in FIG. 1 are labeled with the same reference numbers as in FIG. 1 and are not described again for brevity. In the embodiment, each pixel element of the emissive display device 200 has a structure similar to that of the pixel element shown in FIG. 1. The difference between the pixel element shown in FIG. 2 from the pixel element shown in FIG. 1 is that the retarder film 112 is non-patterned and can be affixed to the color filter films 108, thereby being located at all of the subpixel regions.

Figure 3:
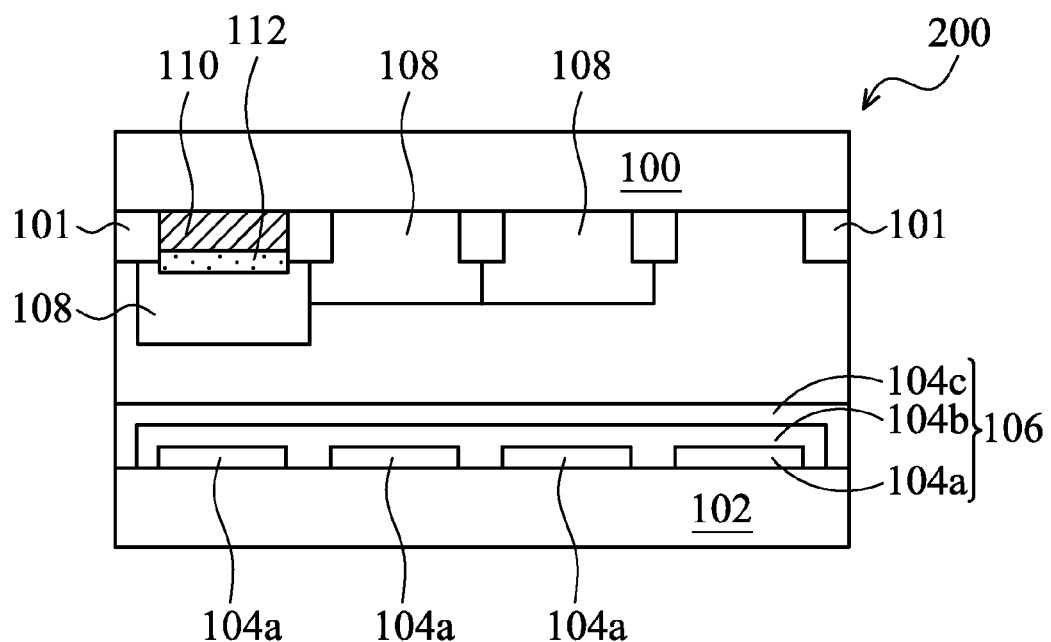

Referring to FIG. 3, which illustrates another exemplary embodiment of a system for displaying images according to the invention. Elements in FIG. 3 that are the same as those in FIG. 1 are labeled with the same reference numbers as in FIG. 1 and are not described again for brevity. In the embodiment, each pixel element of the emissive display device 200 comprises a patterned polarizer film 110 located at a red, green or blue subpixel region. A retarder film 112 is affixed to the patterned polarizer film 110. Three color filter films 108 (i.e., red, green, and blue color filter films) may be disposed between the first and second substrates 100 and 102 to respectively cover the red, green and blue subpixel regions, such that the patterned polarizer film 110 and the retarder film 112 affixed thereto are covered by one of the color filter films 108.

In another embodiment, at least two patterned polarizer films 110 having the respective retarder film 112 affixed thereto may cover two of the red, green and blue subpixel regions, such that the patterned polarizer films 110 having the respective retarder film 112 affixed thereto are covered by two of the color filter films 108, respectively.

Figure 4:
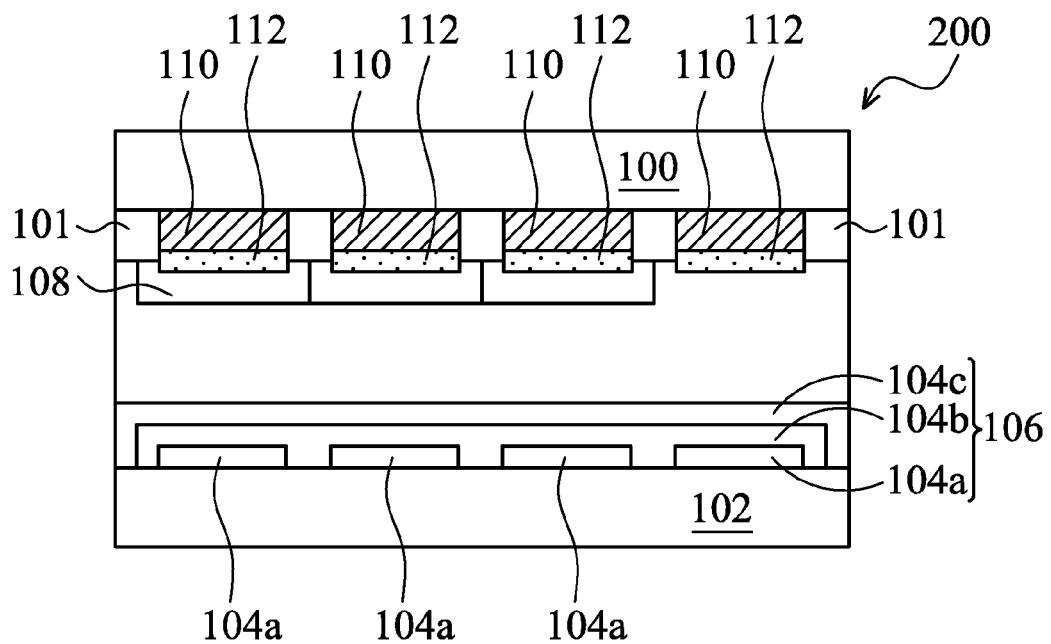

Referring to FIG. 4, which illustrates another exemplary embodiment of a system for displaying images according to the invention. Elements in FIG. 4 that are the same as those in FIG. 3 are labeled with the same reference numbers as in FIG. 3 and are not described again for brevity. In the embodiment, each subpixel region of the pixel element of the emissive display device 200 is covered by a patterned polarizer film 110 having a respective retarder film 112 affixed thereto. Moreover, three color filter films 108 (i.e., red, green, and blue color filter films) may be disposed between the first and second substrates 100 and 102 to respectively cover the patterned polarizer films 110 having a respective retarder film 112 affixed thereto and located at the red, green, and blue subpixel regions; however, not disposing the color filter films 108 may also acceptable be in some embodiments.

Figure 5:
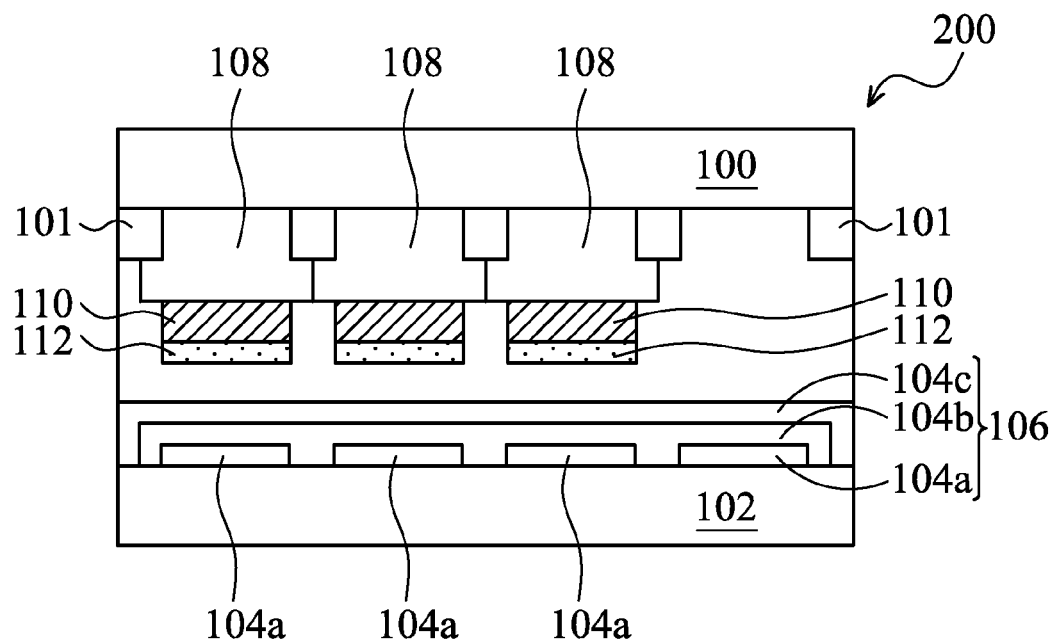

Referring to FIG. 5, which illustrates another exemplary embodiment of a system for displaying images according to the invention. Elements in FIG. 5 that are the same as those in FIG. 1 are labeled with the same reference numbers as in FIG. 1 and are not described again for brevity. In the embodiment, each pixel element of the emissive display device 200 comprises three color filter films 108 (i.e., red, green, and blue color filter films) disposed between the first and second substrates 100 and 102 to respectively cover the red, green and blue subpixel regions. Moreover, at least one patterned polarizer films 110 having a respective retarder film 112 affixed thereto is located on one of the color filter films 108. For example, three patterned polarizer films 110 having a respective retarder film 112 affixed thereto are located on the color filter films 108, respectively, as shown in FIG. 5.

Figure 6:
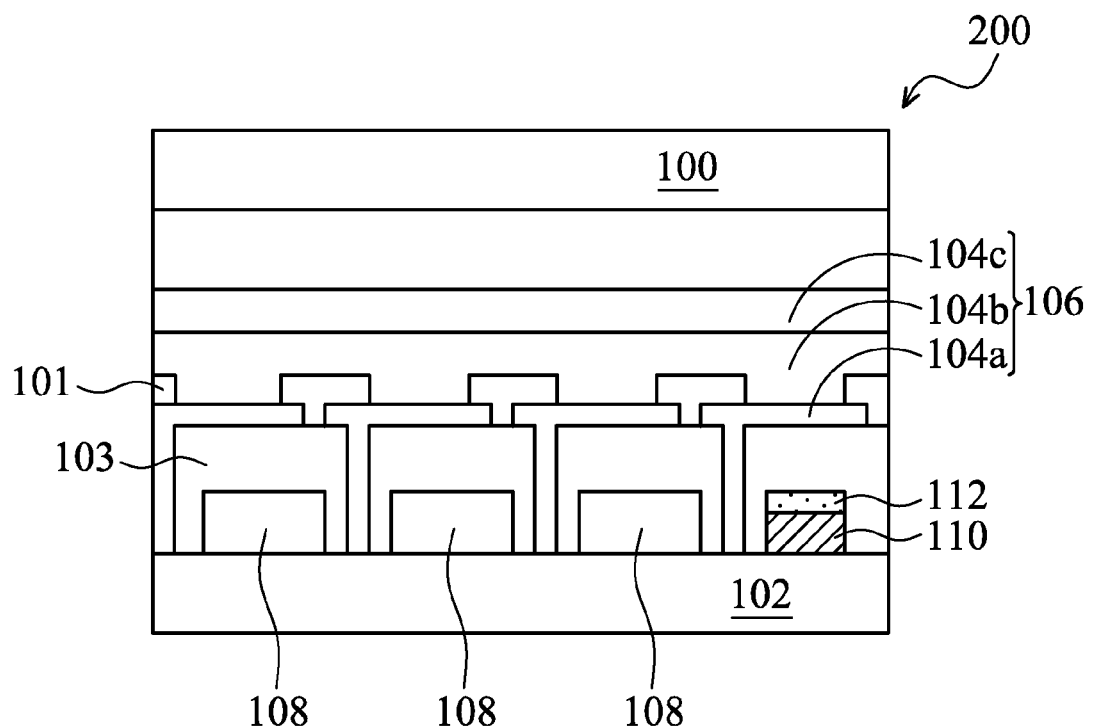

Referring to FIG. 6, which illustrates another exemplary embodiment of a system for displaying images according to the invention. Elements in FIG. 6 that are the same as those in FIG. 1 are labeled with the same reference numbers as in FIG. 1 and are not described again for brevity. In the embodiment, each pixel element of the emissive display device 200 has a structure similar to that of the pixel element shown in FIG. 1. The difference between the pixel element shown in FIG. 6 from the pixel element shown in FIG. 1 is the OLED 106 is a bottom-emission type OLED and is disposed on an insulating layer 103 (e.g., a planarization layer) on the second substrate 102, such that at least one patterned polarizer film 110 is embedded in the insulating layer 103 between the second substrate 102 and the OLED 106. Moreover, a retarder film 112 is correspondingly affixed to the patterned polarizer film 110. In the embodiment, the patterned polarizer film 110 may correspond to a white subpixel region, and three color filter films 108 (i.e., red, green, and blue color filter films) may be disposed between the first and second substrates 100 and 102 to respectively correspond to the subpixel regions without the patterned polarizer film 110 located thereat; however, not disposing the color filter films 108 may also be acceptable in some embodiments.

In another embodiment, at least one of the color filter films 108 may be covered by a patterned polarizer film 110 having a respective retarder film 112 affixed thereto. For example, each color filter film 108 is covered by a patterned polarizer film 110 having a respective retarder film 112 affixed thereto. In yet another embodiment, at least one patterned polarizer film 110 having a respective retarder film 112 affixed thereto may be covered by one of the color filter films 108. For example, each color filter film 108 covers a patterned polarizer film 110 having a respective retarder film 112 affixed thereto.

Figure 7:
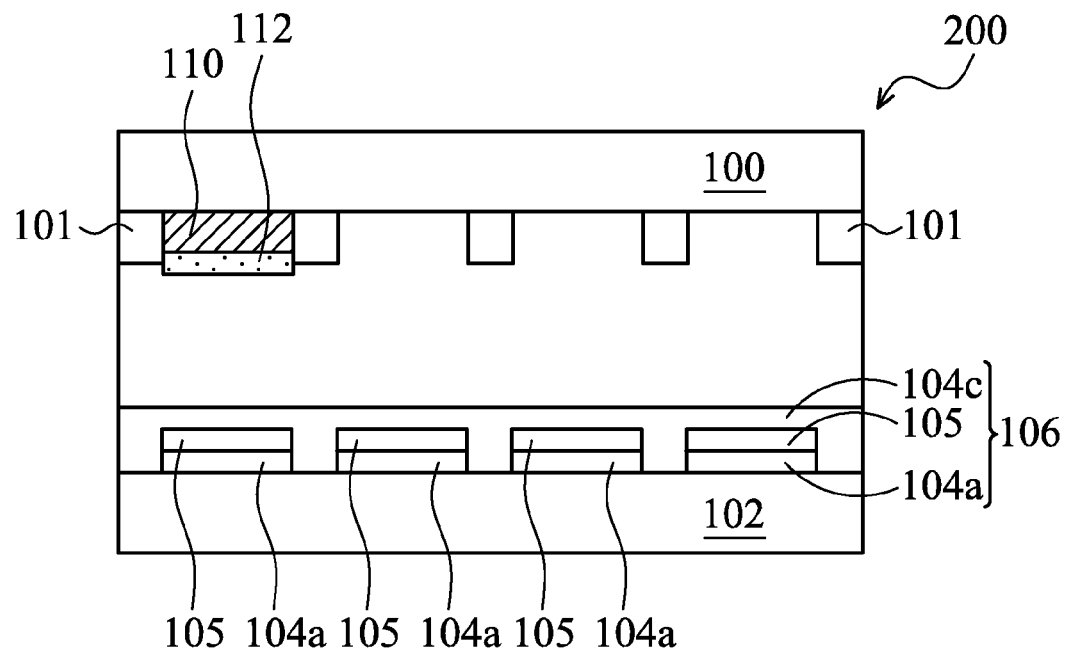

Referring to FIG. 7, which illustrates another exemplary embodiment of a system for displaying images according to the invention. Elements in FIG. 7 that are the same as those in FIG. 1 are labeled with the same reference numbers as in FIG. 1 and are not described again for brevity. In the embodiment, each pixel element of the emissive display device 200 has a structure similar to that of the pixel element shown in FIG. 1. The difference between the pixel element shown in FIG. 7 from the pixel element shown in FIG. 1 is that the OLED 106 is a side by side OLED, such that the first substrate 100 of each pixel element includes three subpixel regions (i.e., red, green and blue subpixel regions), in which at least one patterned polarizer film 110 having a respective retarder film 112 affixed thereto covers one of the subpixel regions. In the embodiment, the side by side OLED 106 may comprise a plurality of anode layers 104a corresponding to the subpixel regions, a plurality of organic light-emitting layers 105 (i.e., red, green and blue organic light-emitting layers) respectively covering the plurality of anode layers 104a, and a cathode layer 104c covering the plurality of organic light-emitting layers 105. In some embodiments, a plurality of optional color filters (not shown) may be disposed between the first and second substrates 100 and 102, such that the pixel element with the side by side OLED 106 has a similar structure as that of the pixel element shown in FIG. 3, 4, 5 or 6.

According to the foregoing embodiments, since the polarizer film is disposed between the first and second substrate of each pixel element of the emissive display device (which is referred to as an in-cell polarizer film), the total thickness of the emissive display device of the invention may be thinner than that of the conventional emissive display device. Moreover, since the in-cell patterned polarizer film for each pixel element of the emissive display device may be located at a white subpixel region only, the problem of the non-uniform cell gap after the encapsulation process due to the existence of color filter films can be mitigated, while enhancing the emitting efficiency of the emissive display device by reducing the occupied area of the polarizer film in each pixel element of the emissive display device. Additionally, since each subpixel region may have a respective patterned polarizer film, the degree of polarization is adjustable.

Figure 8:
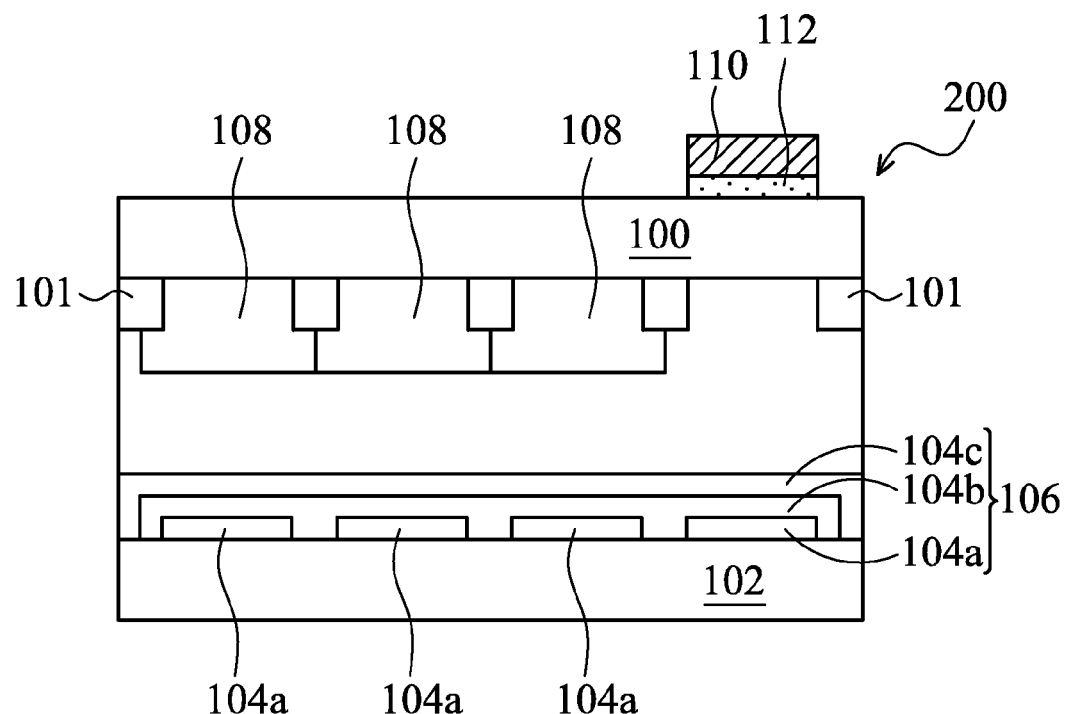

Referring to FIG. 8, which illustrates another exemplary embodiment of a system for displaying images according to the invention. Elements in FIG. 8 that are the same as those in FIG. 1 are labeled with the same reference numbers as in FIG. 1 and are not described again for brevity. In the embodiment, each pixel element of the emissive display device 200 has a structure similar to that of the pixel element shown in FIG. 1. The difference between the pixel element shown in FIG. 8 from the pixel element shown in FIG. 1 is that at least one patterned polarizer film 110 is disposed on the exterior surface of the pixel element to correspondingly cover one of the subpixel regions. For example, the patterned polarizer film 110 is disposed on the first substrate 100 corresponding to a white subpixel region. Also, the patterned polarizer film 110 may be disposed on the first substrate 100 corresponding to a red, green or blue subpixel region, to be located on one of the underlying color filter films 108. Moreover, at least one retarder film 112 is disposed between the first substrate 100 and the patterned polarizer film 110. The retarder film 112 may extend to be affixed to the entire surface of the first substrate 100. In the embodiment, three color filter films 108 (i.e., red, green, and blue color filter films) are disposed between the first and second substrates 100 and 102; however not disposing the color filter films 108 may also be acceptable in some embodiments.

In the embodiment, the OLED 106 may be a top or bottom-emission type OLED or a side by side OLED. However, note that the patterned polarizer film 110 and the retarder film 112 are disposed on the second substrate 102 and opposite to the OLED 106 when the OLED 106 is a bottom-emission type OLED. According to the foregoing embodiments, since the patterned polarizer film for each pixel element of the emissive display device may be disposed at a white subpixel region only, the emitting efficiency of the emissive display device can be enhanced by reducing the occupied area of the polarizer film in each pixel element of the emissive display device. Moreover, since each subpixel region may have a respective patterned polarizer film, the degree of polarization is adjustable.

Figure 9:
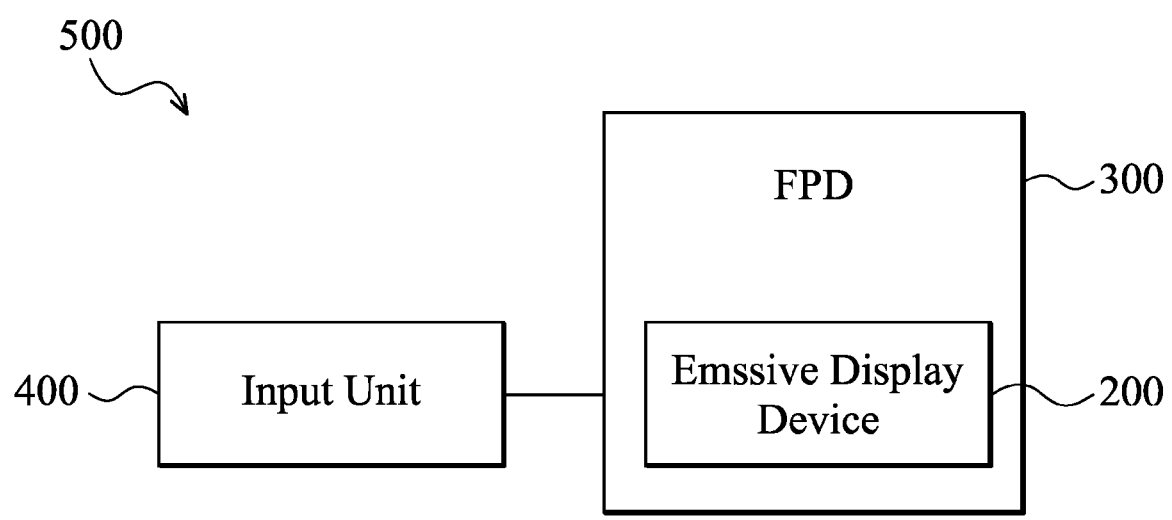
FIG. 9 schematically shows another embodiment of a system for displaying images.

FIG. 9 schematically shows another embodiment of a system for displaying images which, in this case, is implemented as a flat panel display (FPD) 300 or an electronic device 500 such as a laptop computer, a mobile phone, a digital camera, a personal digital assistant (PDA), a desktop computer, a television, a car display or a portable DVD player. The FPD 300 may include the described emissive display device 200, and the FPD 300 may be an organic light-emitting display panel. As shown in FIG. 9, the FPD 300 includes the emissive display device 200 as shown in FIGS. 1 to 8. In some embodiments, the FPD 300 can be incorporated into the electronic device 500. As shown in FIG. 9, the electronic device 500 includes the FPD 300 and an input unit 400. Moreover, the input unit 400 is coupled to the FPD 300 and is operative to provide input signals (e.g. image signals) to the FPD 300 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
an emissive display device comprising a plurality of pixel elements arranged in an array, wherein each pixel element comprises:
a first substrate and a second substrate disposed thereunder, wherein the first substrate includes at least three subpixel regions and a plurality of black matrixes;
an organic light-emitting device disposed between the first substrate and the second substrate and on the second substrate;
at least one patterned polarizer film disposed between the first substrate and the second substrate to be correspondingly located within one of the subpixel regions and surrounded by the plurality of black matrixes; and
at least one retarder film disposed between the first substrate and the second substrate and surrounded by the plurality of black matrixes, and affixed to the patterned polarizer film,
wherein the retarder film is closer to the organic light-emitting device than the patterned polarizer film is to the organic light-emitting device.

2. The system of claim 1, wherein the first substrate comprises four subpixel regions and each pixel element further comprises three color filter films disposed between the first substrate and the second substrate to respectively cover the subpixel regions without the patterned polarizer film located thereat, wherein the patterned polarizer film is located at a white subpixel region.

3. The system of claim 2, wherein the retarder film is affixed to the color filter films.

4. The system of claim 1, wherein each pixel element comprises at least three patterned polarizer films located at the subpixel regions, respectively, and retarder films affixed to the patterned polarizer films, respectively.

5. The system of claim 4, wherein each pixel element further comprises three color filter films between the first substrate and the second substrate to cover the retarder films, respectively.

6. The system of claim 1, wherein each pixel element further comprises three color filter films between the first substrate and the second substrate to cover the subpixel regions, respectively, such that the patterned polarizer film and the retarder film are covered by one of the color filter films.

7. The system of claim 1, wherein each pixel element further comprises three color filter films between the first substrate and the second substrate to cover the subpixel regions, respectively, such that the patterned polarizer film and the retarder film are located on one of the color filter films.

8. The system of claim 1, wherein the organic light-emitting device is a top or bottom-emission type organic light-emitting device.

9. The system of claim 1, wherein the organic light-emitting device is an active or passive matrix organic light-emitting device.

10. The system of claim 1, wherein the organic light-emitting device is a white organic light-emitting device.

11. The system of claim 1, wherein the organic light-emitting device is a side by side organic light-emitting device.

12. The system as claimed in claim 1, further comprising:
a flat panel display comprising the emissive display device; and
an input unit coupled to the flat panel display and operative to provide input signals to the flat panel display, such that the flat panel display displays images.

13. The system of claim 12, wherein the system is an electronic device comprising the flat panel display.

14. The system of claim 13, wherein the electronic device is a laptop computer, a mobile phone, a digital camera, a personal digital assistant, a desktop computer, a television, a car display or a portable DVD player.

15. The system of claim 1, wherein said at least one patterned polarizer film is correspondingly located within only a single subpixel region of each pixel element.

16. A system for displaying images, comprising:
an emissive display device comprising a plurality of pixel elements arranged in an array, wherein each pixel element comprises:
a first substrate and a second substrate disposed thereunder, wherein the first substrate includes at least three subpixel regions and a plurality of black matrixes;
an organic light-emitting device disposed between the first substrate and the second substrate and on the second substrate;
at least one patterned polarizer film disposed on the first substrate and opposite to the organic light-emitting device, to be correspondingly located within one of the subpixel regions; and
a retarder film disposed between the first substrate and the patterned polarizer film, and the retarder film is surrounded by the plurality of black matrixes,
wherein the retarder film is closer to the organic light-emitting device than the patterned polarizer film is to the organic light-emitting device.

17. The system of claim 16, wherein the first substrate comprises four subpixel regions and each pixel element further comprises three color filter films disposed between the first substrate and the second substrate to respectively cover the subpixel regions without the patterned polarizer film located thereat, wherein the patterned polarizer film is located at a white sub-pixel region.

18. The system of claim 16, wherein said at least one patterned polarizer film is correspondingly located within only a single subpixel region of each pixel element.

19. The system of claim 16, wherein the at least one patterned polarizer film is patterned to define areas of the first substrate on which said at least one patterned polarizer film is not disposed.

20. A system for displaying images, comprising:
an emissive display device comprising a plurality of pixel elements arranged in an array, wherein each pixel element comprises:
a first substrate and a second substrate disposed thereunder, wherein the first substrate includes at least three subpixel regions and a plurality of black matrixes;
an organic light-emitting device disposed between the first substrate and the second substrate and on the second substrate;
a plurality of patterned polarizer films separated from each other by the plurality of black matrixes and disposed between the first substrate and the second substrate; and
at least one retarder film disposed between the first substrate and the second substrate and surrounded by the plurality of black matrixes, and affixed to the patterned polarizer films,
wherein the retarder film is closer to the organic light-emitting device than the patterned polarizer film is to the organic light-emitting device.

* * * * *